(12) United States Patent
Iwai et al.

(10) Patent No.: US 8,810,774 B2
(45) Date of Patent: Aug. 19, 2014

(54) EXPOSURE APPARATUS AND DEVICE FABRICATION METHOD

(75) Inventors: Toshiki Iwai, Utsunomiya (JP); Ryo Sasaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 466 days.

(21) Appl. No.: 13/178,995

(22) Filed: Jul. 8, 2011

(65) Prior Publication Data

US 2012/0008122 A1  Jan. 12, 2012

(30) Foreign Application Priority Data

Jul. 8, 2010  (JP) ................. 2010-156185

(51) Int. Cl.
*G03B 27/53* (2006.01)
*G03F 9/00* (2006.01)

(52) U.S. Cl.
CPC ............. *G03B 27/53* (2013.01); *G03F 9/7088* (2013.01); *G03F 9/7046* (2013.01)
USPC ............... 355/55; 355/77; 356/624

(58) Field of Classification Search
CPC ... G03F 9/7023; G03F 9/7026; G03F 9/7003; G03F 9/7088; G03F 9/7034; G03F 7/70641; G03B 27/53
USPC .......... 355/53, 55, 72, 75; 356/401, 614, 622, 356/624
See application file for complete search history.

(56) References Cited

U.S. PATENT DOCUMENTS

| | | | | |
|---|---|---|---|---|
| 5,315,349 A | * | 5/1994 | Kamon | ............................ 355/53 |
| 5,321,493 A | * | 6/1994 | Kamon | ........................ 356/124 |
| 5,636,000 A | | 6/1997 | Ushida et al. | |
| 7,619,717 B2 | | 11/2009 | Magnusson | |
| 2005/0024612 A1 | * | 2/2005 | Hirukawa et al. | ............... 355/55 |
| 2007/0260419 A1 | * | 11/2007 | Hagiwara | ..................... 702/150 |
| 2009/0274983 A1 | | 11/2009 | Ogasawara | |

FOREIGN PATENT DOCUMENTS

| | | |
|---|---|---|
| JP | 0817719 A | 1/1996 |
| JP | 11-145054 A | 5/1999 |
| JP | 2003197510 A | 7/2003 |
| JP | 2004047786 A | 2/2004 |
| JP | 2008112991 A | 5/2008 |
| JP | 2009272387 A | 11/2009 |

OTHER PUBLICATIONS

Japanese Office Action cited in Japanese counterpart application JP2010-156185, dated Apr. 4, 2014.

* cited by examiner

*Primary Examiner* — Steven H Whitesell Gordon
(74) *Attorney, Agent, or Firm* — Rossi, Kimms & McDowell LLP

(57) ABSTRACT

The present invention provides an exposure apparatus including an obtaining unit configured to obtain data of a first imaging position at which light from a first pattern having, as a longitudinal direction thereof, a first direction perpendicular to an optical axis of a projection optical system forms an image via the projection optical system, and data of a second imaging position at which light from a second pattern having, as a longitudinal direction thereof, a second direction which is not parallel to the first direction and is perpendicular to the optical axis forms an image via the projection optical system, when the first pattern and the second pattern are respectively placed on an object plane of the projection optical system, and a control unit configured to control a stage so that a substrate is positioned at a target position of the substrate along the optical axis.

5 Claims, 7 Drawing Sheets

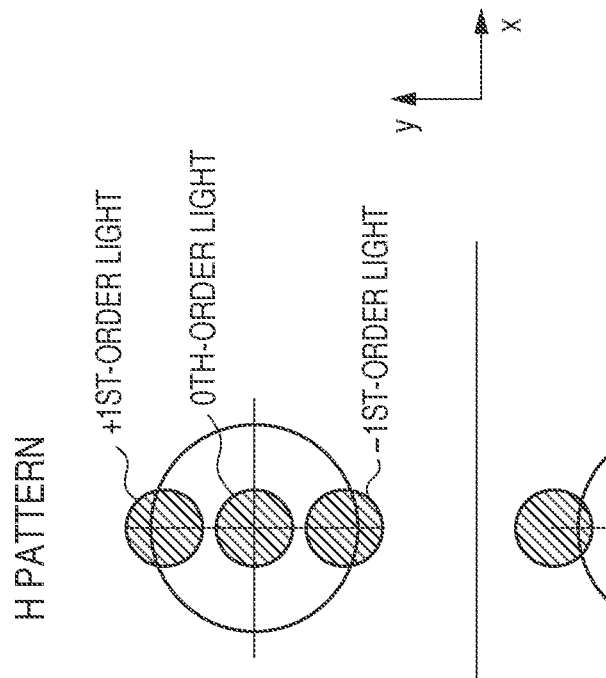
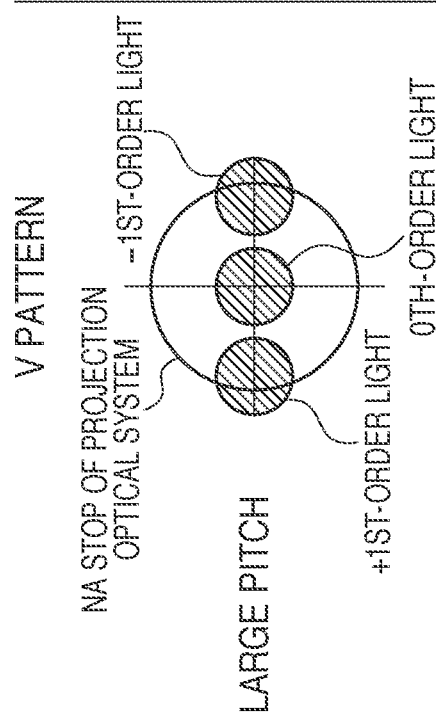
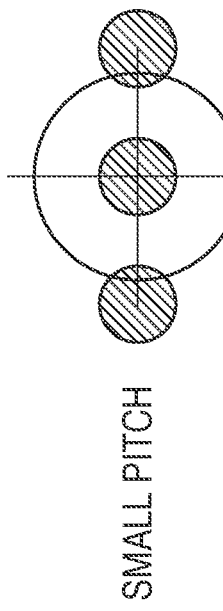
FIG. 2A  V PATTERN
FIG. 2C  H PATTERN
FIG. 2B  SMALL PITCH
FIG. 2D

FIG. 3

| EXPOSURE RECIPE | RETICLE PATTERN | PATTERN LINE WIDTH (PITCH) | EXPOSURE REGION | FOCUS POSITION MEASUREMENT | WAFER POSITION |
|---|---|---|---|---|---|
| A | H PATTERN | — | — | H PATTERN | FOCUS POSITION OF LIGHT FROM H PATTERN |
| B | V PATTERN | — | — | V PATTERN | FOCUS POSITION OF LIGHT FROM V PATTERN |
| C | H PATTERN / V PATTERN | H PATTERN > V PATTERN | H PATTERN AND V PATTERN HAVE NO DIFFERENCE | H PATTERN & V PATTERN | POSITION OBTAINED BY WEIGHTING FOCUS POSITION OF LIGHT FROM V PATTERN |
| D | H PATTERN / V PATTERN | H PATTERN AND V PATTERN HAVE NO DIFFERENCE | H PATTERN > V PATTERN | H PATTERN & V PATTERN | POSITION OBTAINED BY WEIGHTING FOCUS POSITION OF LIGHT FROM H PATTERN |
| E | H PATTERN / V PATTERN | H PATTERN AND V PATTERN HAVE NO DIFFERENCE | H PATTERN AND V PATTERN HAVE NO DIFFERENCE | H PATTERN & V PATTERN | AVERAGE POSITION BETWEEN FOCUS POSITION OF LIGHT FROM H PATTERN AND THAT OF LIGHT FROM V PATTERN |

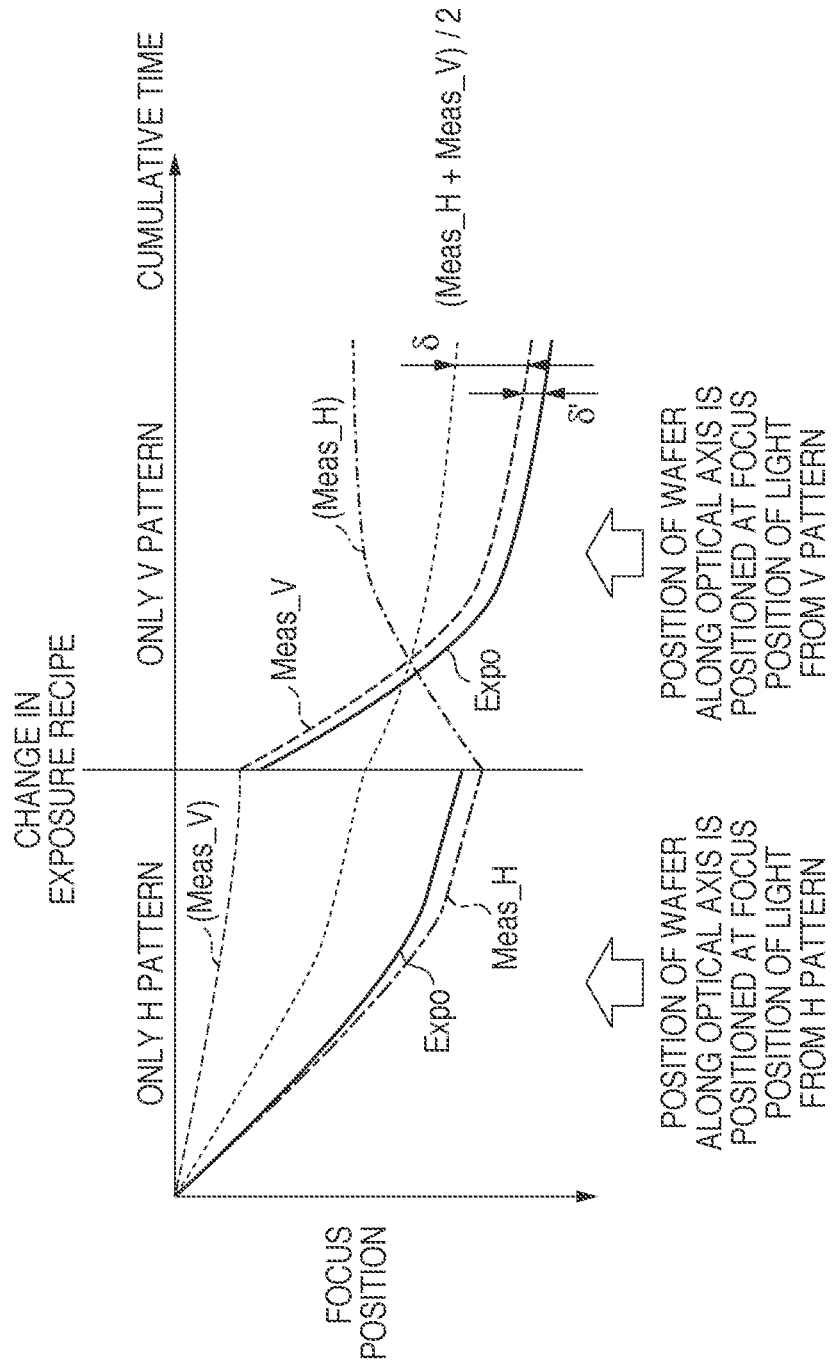

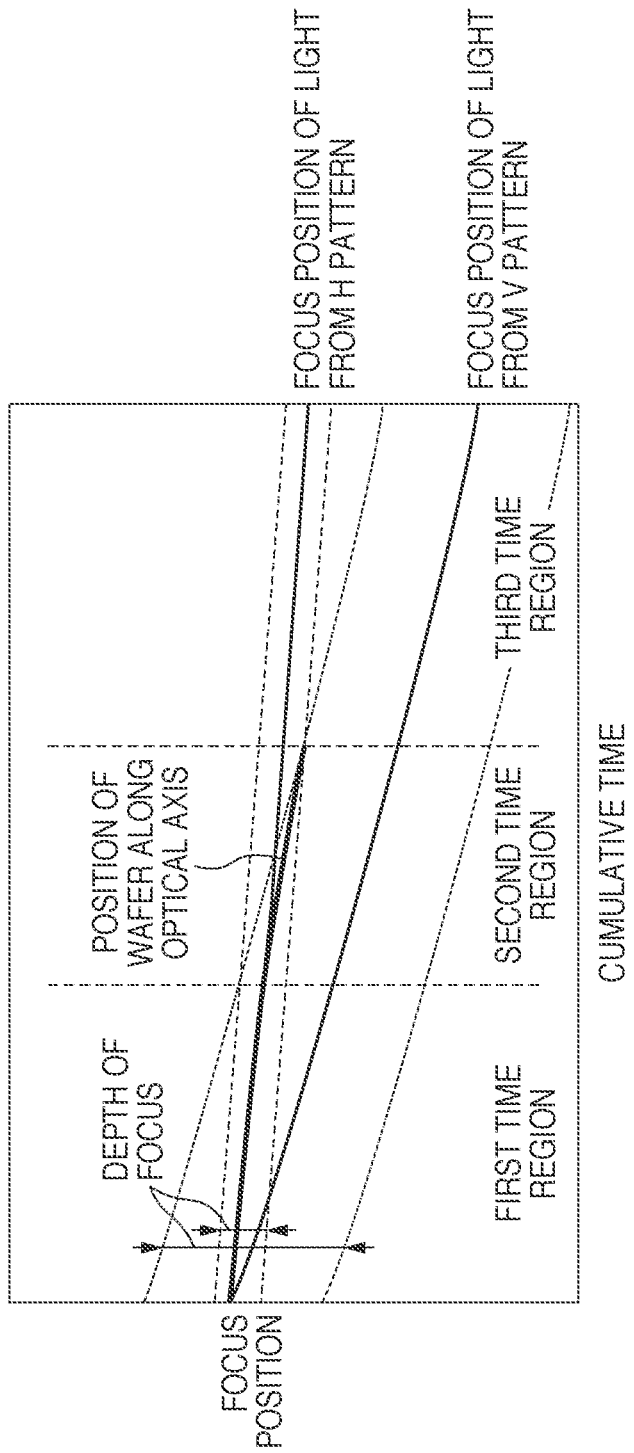

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

An exposure apparatus is employed to fabricate semiconductor devices such as a semiconductor memory and a logic circuit using a photolithography technique. The exposure apparatus projects and transfers a pattern formed on a reticle (mask) onto a substrate such as a wafer by a projection optical system.

When the exposure apparatus starts exposure, the projection optical system partially absorbs exposure light, so its temperature changes and its optical characteristic, in turn, changes. Also, the pattern of the reticle generally includes a pattern (V pattern) having the vertical direction as its longitudinal direction, and a pattern (H pattern) having the horizontal direction as its longitudinal direction. Therefore, when the V pattern and the H pattern have different pitches, the change in temperature of the projection optical system resulting from factors associated with exposure light varies between the light path of light from the H pattern and that of light from the V pattern. As a result, the shapes and internal refractive index distributions of a lens and mirror of the projection optical system change due to the difference between the change in temperature in the light path of light from the H pattern and that in the light path of light from the V pattern, thus generating astigmatism.

Japanese Patent Laid-Open No. 11-145054 discloses a technique for reducing the adverse effect of astigmatism. The technique disclosed in Japanese Patent Laid-Open No. 11-145054 will be described with reference to FIG. 8. FIG. 8 is a graph showing the relationship between the cumulative exposure time (abscissa) and the focus positions (ordinate) of light from the H pattern and light from the V pattern. As the cumulative exposure time increases, the focus position Meas_H of light from the H pattern and the focus position Meas_V of light from the V pattern change due to a change in temperature of the projection optical system resulting from factors associated with exposure light, as shown in FIG. 8. Hence, Japanese Patent Laid-Open No. 11-145054 determines the average position between the focus position Meas_H of light from the H pattern and the focus position Meas_V of light from the V pattern as a focus position in exposure, thereby reducing defocus resulting from astigmatism.

However, when the average position between the focus position of light from the H pattern and that of light from the V pattern is determined as a focus position in exposure, this average position falls outside the depths of focus of these patterns. If, for example, the H pattern has an occupied area larger than the V pattern on the reticle, the rise in temperature in the light path of light from the H pattern is greater than that in the light path of light from the V pattern. In this case, a difference occurs between the amount of change in focus position of light from the H pattern and that of light from the V pattern, so the above-mentioned problem becomes especially serious. Also, in general, the pattern actually transferred onto the substrate has a depth of focus which differs depending on the pattern direction. Therefore, a shift occurs between the focus position optimum for exposure and the average position (the focus position in exposure) between the focus position of light from the H pattern and that of light from the V pattern.

SUMMARY OF THE INVENTION

The present invention provides a technique advantageous in determining the position of a substrate along the optical axis in projecting the pattern of a reticle onto the substrate.

According to one aspect of the present invention, there is provided an exposure apparatus including a projection optical system configured to project a pattern of a mask onto a substrate, a stage configured to move the substrate, an obtaining unit configured to obtain data of a first imaging position at which light from a first pattern having, as a longitudinal direction thereof, a first direction perpendicular to an optical axis of the projection optical system forms an image via the projection optical system, and data of a second imaging position at which light from a second pattern having, as a longitudinal direction thereof, a second direction which is not parallel to the first direction and is perpendicular to the optical axis of the projection optical system forms an image via the projection optical system, when the first pattern and the second pattern are respectively placed on an object plane of the projection optical system, and a control unit configured to control the stage so that the substrate is positioned at a target position of the substrate along the optical axis in projecting the pattern of the mask onto the substrate, wherein the control unit controls the stage so that the substrate is positioned at a midpoint, as the target position, between an endpoint which falls within a depth of focus at the second imaging position, of a lower endpoint and an upper endpoint of a depth of focus at the first imaging position obtained by the obtaining unit, and an endpoint which falls within the depth of focus at the first imaging position, of a lower endpoint and an upper endpoint of the depth of focus at the second imaging position obtained by the obtaining unit, when a mixed pattern which combines a pattern having the first direction as a longitudinal direction thereof and a pattern having the second direction as a longitudinal direction thereof is determined as the pattern of the mask and projected onto the substrate.

Further features of the present invention will become apparent from the following description of exemplary embodiments with reference to the attached drawings.

BRIEF DESCRIPTION OF THE DRAWINGS

FIGS. 2A to 2D are views for explaining the principle in which exposure astigmatism is generated.

FIG. 3 is a table showing the relationship between the exposure recipe and the focus position.

FIG. 4 is a graph schematically showing the position of a wafer along the optical axis of a projection optical system in projecting the pattern of a reticle onto the wafer.

FIG. 7 is a graph showing the relationship between the cumulative time from the start of a job used to project the mixed pattern onto the wafer, and the focus positions of light from the H pattern and light from the V pattern.

DESCRIPTION OF THE EMBODIMENTS

Figure 1B:
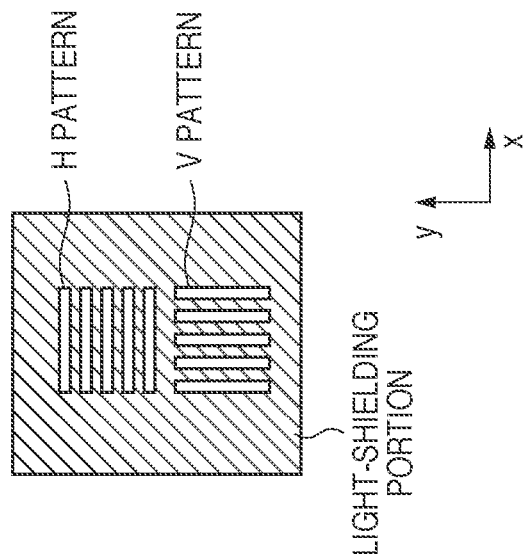
FIGS. 1A and 1B are views showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

Figure 1A:
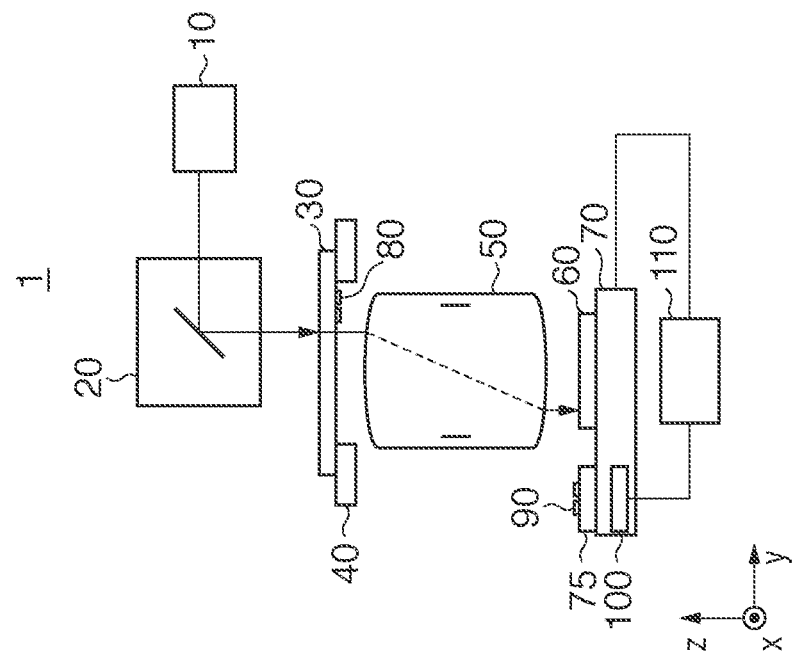

FIGS. 1A and 1B are views showing the arrangement of an exposure apparatus 1 according to an aspect of the present invention. The exposure apparatus 1 is a projection exposure apparatus which transfers the pattern of a reticle onto a wafer by the step-and-scan scheme or the step-and-repeat scheme.

The exposure apparatus 1 includes an illumination optical system 20 which illuminates a reticle 30 (a predetermined region defined on it) with light emitted by a light source 10, and a reticle stage 40 which holds and moves the reticle 30, as shown in FIG. 1A. The exposure apparatus 1 also includes a projection optical system 50 which projects the pattern of the reticle 30 onto a wafer (substrate) 60, and a wafer stage 70 which holds and moves the wafer 60. The exposure apparatus 1 moreover includes measurement patterns 80 and 90, a detection unit 100, and a control unit 110.

The measurement pattern 80 is placed on the object plane of the projection optical system 50 in measuring the focus position (that is, the imaging position), and is formed on the reticle 30 in this embodiment. However, the measurement pattern 80 may be formed on a reticle reference plate placed on the reticle stage 40 to be flush with the reticle 30. The measurement pattern 80 includes an H pattern and a V pattern each having a line-and-space structure, as shown in FIG. 1B. The H pattern and the V pattern are formed by, for example, forming a light-shielding portion on a glass substrate using, for example, chromium (Cr). Note that the H pattern is a first pattern having, as its longitudinal direction, a first direction perpendicular to the optical axis of the projection optical system 50, and the V pattern is a second pattern having, as its longitudinal direction, a second direction which is not parallel to the first direction and is perpendicular to the optical axis of the projection optical system 50.

The measurement pattern 90 is placed on the image plane of the projection optical system 50 in measuring the focus position, and is formed on a wafer reference plate 75 placed on the wafer stage 70 to be flush with the wafer 60 in this embodiment. The measurement pattern 90 includes an H pattern and a V pattern corresponding to the H pattern and the V pattern, respectively, which constitute the measurement pattern 80.

The detection unit 100 detects the amount of light having passed through the measurement pattern 80, projection optical system 50, and measurement pattern 90. Note that the measurement patterns 80 and 90 are arranged such that light from the H pattern (or the V pattern) which constitutes the measurement pattern 80 passes through the H pattern (or the V pattern) which constitutes the measurement pattern 90 via the projection optical system 50.

A case in which the focus position (that is, a first imaging position at which imaging is performed via the projection optical system 50) of light from the H pattern which constitutes the measurement pattern 80 is measured upon placing the measurement pattern 80 on the object plane of the projection optical system 50 will be described. First, the H pattern which constitutes the measurement pattern 80 placed in the illumination region of the illumination optical system 20 is illuminated with light from the light source 10. At this time, the measurement pattern 90 (its constituent H pattern) is placed on the image plane of the projection optical system 50. Next, the amount of light having passed through the H pattern which constitutes the measurement pattern 80, the projection optical system 50, and the H pattern which constitutes the measurement pattern 90 is detected by the detection unit 100 while moving the H pattern which constitutes the measurement pattern 80 along the optical axis of the projection optical system 50. The position of the measurement pattern 90 (its constituent H pattern), at which the amount of light detected by the detection unit 100 maximizes, is obtained as the focus position of light from the H pattern which constitutes the measurement pattern 80. Note that the focus position (a second imaging position at which imaging is performed via the projection optical system 50) of light from the V pattern which constitutes the measurement pattern 80 can similarly be measured using the V pattern which constitutes the measurement pattern 80 and that which constitutes the measurement pattern 90.

The control unit 110 includes a CPU and memory and controls the entire exposure apparatus 1 (its overall operation). In this embodiment, the control unit 110 determines the position of the wafer 60 along the optical axis of the projection optical system 50 in projecting the pattern of the reticle 30 onto the wafer 60, and controls movement of the wafer 60 by the wafer stage 70 so that the wafer 60 is positioned at the determined position.

The principle in which a difference (exposure astigmatism) occurs between the amount of change in focus position of light from the H pattern and that of light from the V pattern during exposure will be explained herein. If the H pattern and the V pattern have different pitches in the measurement pattern 80, they also have different angles of diffraction, so light from the H pattern and light from the V pattern pass through different positions in the projection optical system 50. FIGS. 2A to 2D are views showing the positions through which light beams from H patterns pass and those through which light beams from V patterns pass on the pupil plane of the projection optical system 50 when the measurement pattern 80 is illuminated with an illumination coherence factor σ of 0.5. More specifically, FIG. 2A shows the positions through which light beams diffracted by a V pattern having a large pitch pass on the pupil plane of the projection optical system 50, and FIG. 2B shows the positions through which light beams diffracted by a V pattern having a small pitch pass on this pupil plane. Also, FIG. 2C shows the positions through which light beams diffracted by an H pattern having a large pitch pass on the pupil plane of the projection optical system 50, and FIG. 2D shows the positions through which light beams diffracted by an H pattern having a small pitch pass on this pupil plane. Referring to FIGS. 2A to 2D, hatched portions indicate the positions through which light beams from the H pattern or the V pattern pass on the pupil plane of the projection optical system 50; a central circle indicates a 0th-order light beam, and left and right circles or upper and lower circles indicate ±1st-order light beams, respectively.

Referring to FIGS. 2A to 2D, as the pitch increases, the angle of diffraction by the pattern reduces, and the position through which a 0th-order light beam passes and those through which ±1st-order light beams pass on the pupil plane of the projection optical system 50 come closer to each other. Also, light is diffracted in the y direction by the H pattern and in the x direction by the V pattern, so the diffraction direction changes depending on the longitudinal direction of the pattern.

The temperature of the region through which light passes in the projection optical system rises due to absorption of light (exposure light). However, as described above, the region through which light passes differs depending on the pitch and longitudinal direction of the pattern, so a temperature distribution is generated in the projection optical system. The shapes and internal refractive index distributions of a lens and mirror which constitute the projection optical system change depending on this temperature distribution, thus generating astigmatism.

Hence, the control unit 110 determines the position of the wafer 60 along the optical axis of the projection optical system 50 in projecting the pattern of the reticle 30 onto the wafer 60, in accordance with an exposure recipe (for example, a setting value to be set in the exposure apparatus), as shown in FIG. 3. A case (exposure recipe A) in which a pattern (that is, an H pattern) including only a pattern having the same longitudinal direction as that of the H pattern is determined as the pattern of the reticle 30 and transferred onto the wafer 60 will be considered as an example. In case of exposure recipe A, focus position measurement is performed only for the H pattern, and the measured focus position (the focus position of light from the H pattern) is determined as the position of the wafer 60 along the optical axis of the projection optical system 50. A case (exposure recipe B) in which a pattern (that is, a V pattern) including only a pattern having the same longitudinal direction as that of the V pattern is determined as the pattern of the reticle 30 and transferred onto the wafer 60 will be considered as an example as well. In case of exposure recipe B, focus position measurement is performed only for the V pattern, and the measured focus position (the focus position of light from the V pattern) is determined as the position of the wafer 60 along the optical axis of the projection optical system 50.

FIG. 4 is a graph schematically showing the position of the wafer 60 along the optical axis of the projection optical system 50 in projecting the pattern of the reticle 30 onto the wafer 60 when exposure is performed after changing the exposure recipe from exposure recipe A to exposure recipe B. FIG. 4 shows the cumulative time from the start of a job used to project the pattern of the reticle 30 onto the wafer 60 on the abscissa, and the focus position (the position of the wafer 60 along the optical axis of the projection optical system 50) on the ordinate. A curve indicated by a dashed line indicates the focus position Meas_V of light from the V pattern, and that indicated by an alternate long and short dashed line indicates the focus position Meas_H of light from the H pattern. Note that the focus position Meas_V of light from the V pattern and the focus position Meas_H of light from the H pattern can be measured by the measurement pattern 80, measurement pattern 90, and detection unit 100, as described above.

Referring to FIG. 4, in exposure recipe A, the control unit 110 determines the focus position Meas_H of light from the H pattern as the position of the wafer 60 along the optical axis of the projection optical system 50, and the wafer 60 is positioned at the determined position via the wafer stage 70. In practice, the H pattern serving as the pattern of the reticle 30 to be projected onto the wafer 60 and that which constitutes the measurement pattern 80 have different line widths. Therefore, an error may occur between the focus position Expo of light from the H pattern to be projected onto the wafer 60 and the focus position Meas_H of light from the H pattern which constitutes the measurement pattern 80. In this case, the focus position can be determined by forming the measurement pattern 80 using a plurality of H patterns having different line widths, and selecting an H pattern having a line width close to that of the H pattern to be projected onto the wafer 60 among these plurality of H patterns. This makes it possible to reduce the error generated between the focus position Expo of light from the H pattern to be projected onto the wafer 60 and the focus position Meas_H of light from the H pattern which constitutes the measurement pattern 80.

After a change from exposure recipe A to exposure recipe B takes place, the control unit 110 determines the focus position Meas_V of light from the V pattern as the position of the wafer 60 along the optical axis of the projection optical system 50, and the wafer 60 is positioned at the determined position via the wafer stage 70. At this time, exposure recipe A has already been executed before exposure recipe B is executed, so the temperature of the projection optical system 50 has risen due to factors associated with exposure light. Therefore, as shown in FIG. 4, the position of the wafer 60 along the optical axis of the projection optical system 50, which is determined at the start of exposure recipe B, is different from that of the wafer 60 along the optical axis of the projection optical system 50, which is determined at the start of exposure recipe as the first exposure recipe.

A case in which the average position (Meas_H+Meas_V)/2 between the focus position of light from the H pattern and that of light from the V pattern is determined as the position of the wafer 60 along the optical axis of the projection optical system 50, as in the prior art, will be considered herein. In this case, in exposure recipe B, the focus position Meas_V of light from the V pattern and the focus position Expo of light from the V pattern actually projected onto the wafer 60 may have a large difference $\delta$, as shown in FIG. 4. On the other hand, in this embodiment, because the focus position Meas_V of light from the V pattern is determined as the position of the wafer 60 along the optical axis of the projection optical system 50, it is possible to reduce its difference $\delta'$ from the focus position Expo of light from the V pattern to be projected onto the wafer 60.

Note that when only the H pattern or the V pattern is projected onto the wafer 60, as in exposure recipe A or B, only the focus position of light from the H pattern or that of light from the V pattern need only be measured, as described above. Therefore, the time taken to measure the focus position can be shortened as compared with the prior art. The timing at which the focus position of light from the H pattern or that of light from the V pattern is measured is not limited to the time at which the exposure recipe is changed, and may be the completion of processing of every wafer, every lot, or every shot on the wafer.

Figure 5:
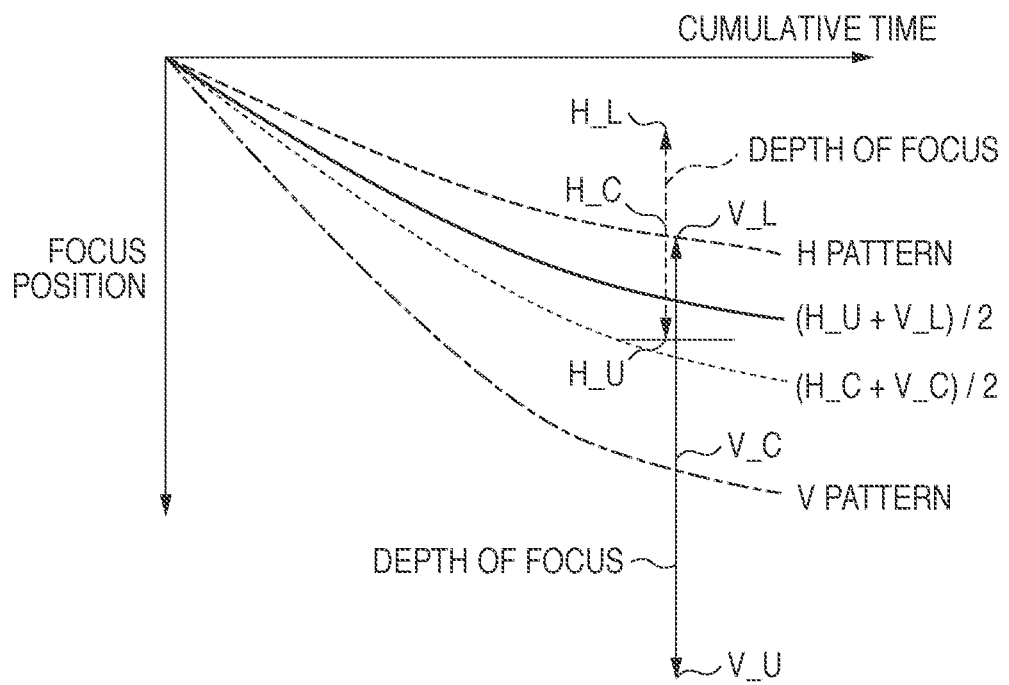
FIG. 5 is a graph for explaining determination of the position of the wafer along the optical axis of the projection optical system in projecting a mixed pattern which combines an H pattern and a V pattern onto the wafer.

Referring back to FIG. 3, a case (exposure recipes C, D, and E) in which a mixed pattern which combines an H pattern and a V pattern is determined as the pattern of the reticle 30 and transferred onto the wafer 60 will be considered. FIG. 5 is a graph for explaining determination of the position of the wafer 60 along the optical axis of the projection optical system 50 in projecting a mixed pattern which combines an H pattern and a V pattern onto the wafer 60 when the mixed pattern is transferred onto the wafer 60. FIG. 5 shows the cumulative time from the start of a job used to project the mixed pattern onto the wafer 60 on the abscissa, and the focus position (the position of the wafer 60 along the optical axis of the projection optical system 50) on the ordinate. A curve indicated by a dashed line indicates the focus position H_C of light from the H pattern, and that indicated by an alternate long and short dashed line indicates the focus position V_C of light from the V pattern. Also, let H_L and H_U be the lower endpoint and upper endpoint, respectively, of the depth of focus at the focus position H_C of light from the H pattern, and V_L and V_U be the lower endpoint and upper endpoint, respectively, of the depth of focus at the focus position V_C of light from the V pattern.

In the prior art, as described above, the average position (H_C+V_C)/2 between the focus position H_C of light from the H pattern and the focus position V_C of light from the V pattern is determined as the position of the wafer 60 along the optical axis of the projection optical system 50. In this case, as the cumulative time increases, the average position (H_C+V_C)/2 falls outside the depth-of-focus region (the range between the lower endpoint H_L and the upper endpoint H_U) at the focus position H_C of light from the H pattern, leading to an exposure failure.

Hence, the control unit 110 determines the position of the wafer 60 along the optical axis of the projection optical system 50 from the depth of focus at the focus position H_C of light from the H pattern and that at the focus position V_C of light from the V pattern. More specifically, first, an endpoint (the upper endpoint H_U in this embodiment) which falls within the depth of focus at the focus position V_C of light from the V pattern, of the lower endpoint H_L and upper endpoint H_U of the depth of focus at the focus position H_C of light from the H pattern, is specified. Next, an endpoint (the lower endpoint V_L in this embodiment) which falls within the depth of focus at the focus position H_C of light from the H pattern, of the lower endpoint V_L and upper endpoint V_U of the depth of focus at the focus position V_C of light from the V pattern, is specified. A position corresponding to the midpoint (a point given by (H_U+V_L)/2 in this embodiment) between the two endpoints specified in this way is determined as the position of the wafer 60 along the optical axis of the projection optical system 50. In this manner, a problem that one of the two patterns defocuses can be avoided by determining the position of the wafer 60 along the optical axis of the projection optical system 50 in consideration of the depths of focus at the focus positions of light from the H pattern and light from the V pattern. Note that the depths of focus at the focus positions of light from the H pattern and light from the V pattern can be obtained by, for example, actually transferring the H pattern and the V pattern onto the wafer and measuring the H pattern and V pattern which are transferred onto the wafer.

If it is difficult to obtain the depths of focus at the focus positions of light from the H pattern and light from the V pattern, the relationship among the line width of the H pattern, the line width of the V pattern, and the depth of focus is preferably obtained in advance. For example, the upper endpoint H_U which falls within the depth of focus at the focus position V_C of light from the V pattern, of the endpoints of the depth of focus at the focus position H_C of light from the H pattern, is defined as a function $f(LW\_H)$ of the line width LW_H of the V pattern. Similarly, the lower endpoint V_L which falls within the depth of focus at the focus position H_C of light from the H pattern, of the endpoints of the depth of focus at the focus position V_C of light from the V pattern, is defined as a function $f(LW\_V)$ of the line width LW_V of the H pattern. In this case, the upper endpoint H_U is expressed as H_C+f(LW_H), and the lower endpoint V_L is expressed as V_C−f(LW_V), so a position corresponding to {H_C+f(LW_H)+V_C−f(LW_V)}/2 is determined as the position of the wafer 60 along the optical axis of the projection optical system 50.

Also, ratios Hratio and Vratio which respectively multiply the focus position of light from the H pattern and that of light from the V pattern may be determined in advance in consideration of the depths of focus at the focus positions of light from the H pattern and light from the V pattern. In this case, a position corresponding to H_C×Hratio+V_C×Vratio is determined as the position of the wafer 60 along the optical axis of the projection optical system 50. Note that Hratio+Vratio=100%.

Figure 6A:
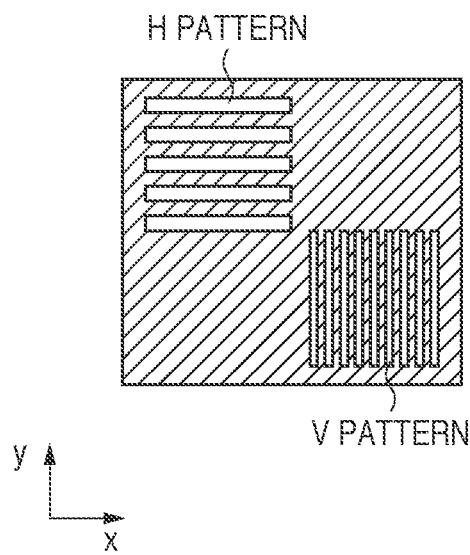
FIGS. 6A and 6B are views each illustrating a mixed pattern which combines an H pattern and a V pattern as an example of the pattern of the reticle.
Figure 6B:
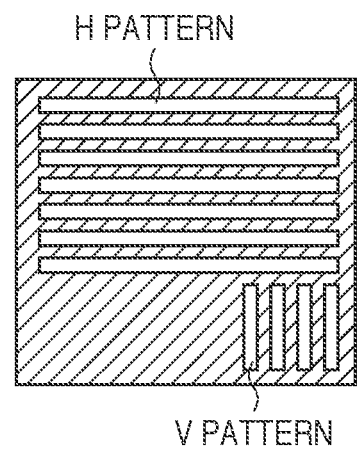
Figure 8:
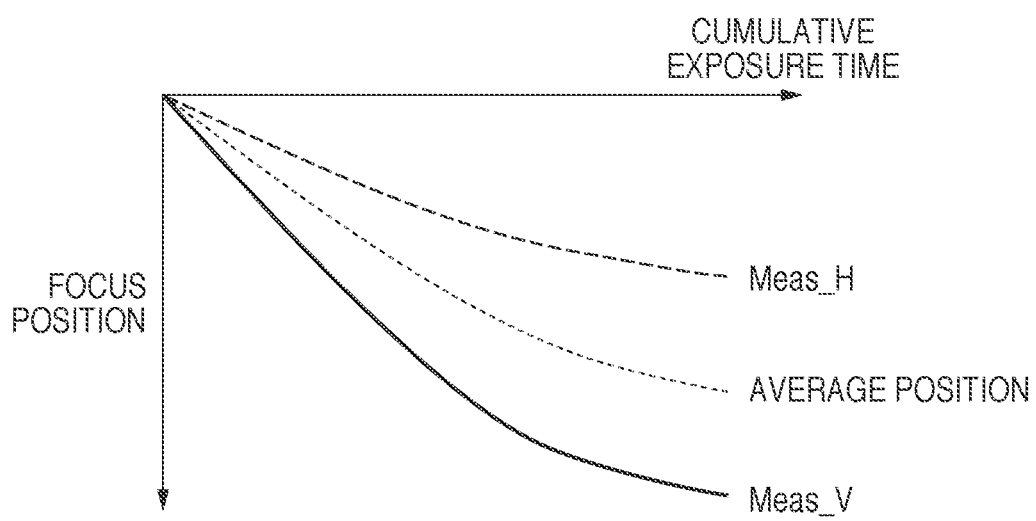
FIG. 8 is a graph for explaining the prior art.

Exposure recipes C, D, and E shown in FIG. 3 will be described herein with reference to FIGS. 6A and 6B. FIGS. 6A and 6B are views each illustrating a mixed pattern which combines an H pattern and a V pattern as an example of the pattern of the reticle 30. The mixed pattern shown in FIG. 6A is a pattern corresponding to exposure recipe C. In the mixed pattern shown in FIG. 6A, the occupied areas of the H pattern and the V pattern (the areas of the exposure region of the H pattern and that of the V pattern) are equal and have a ratio of 1:1, but the V pattern has a line width smaller than that of the H pattern. As a result, the depth of focus is smaller at the focus position of light from the V pattern than at that of light from the H pattern. Therefore, the position of the wafer 60 along the optical axis of the projection optical system 50 is determined by weighting the focus position of light from the V pattern in consideration of the depths of focus in the above-mentioned way. The mixed pattern shown in FIG. 6B is a pattern corresponding to exposure recipe D. In the mixed pattern shown in FIG. 6B, the H pattern and the V pattern have the same line width, but the H pattern has an exposure region larger than that of the V pattern. Therefore, the position of the wafer 60 along the optical axis of the projection optical system 50 is determined by weighting the focus position of light from the H pattern in consideration of the depths of focus in the above-mentioned way. Note that in a mixed pattern corresponding to exposure recipe E, the occupied areas of the H pattern and the V pattern are equal and have a ratio of 1:1, but they have the same line width. Therefore, the average position between the focus position of light from the H pattern and that of light from the V pattern is determined as the position of the wafer 60 along the optical axis of the projection optical system 50, in consideration of the depths of focus in the above-mentioned way. Note that even a mixed pattern may have a sufficiently large depth of focus at the focus position of light from the H pattern or that of light from the V pattern. In this case, the focus position of light from a pattern having a smaller depth of focus may be determined as the position of the wafer 60 along the optical axis of the projection optical system 50.

When a mixed pattern which combines an H pattern and a V pattern is transferred onto the wafer 60, it is also possible to change the method of determining the position of the wafer 60 along the optical axis of the projection optical system 50 in accordance with the cumulative time from the start of exposure (job). In this embodiment, the period in which exposure (job) is performed is defined as a first time region, a second time region, and a third time region sequentially, as shown in FIG. 7. FIG. 7 shows the cumulative time from the start of a job used to project the mixed pattern onto the wafer 60 on the abscissa, and the focus position (the position of the wafer 60 along the optical axis of the projection optical system 50) on the ordinate.

In the first time region, the entire depth-of-focus region between the lower endpoint and upper endpoint of the depth of focus at the focus position of light from the H pattern overlaps the depth-of-focus region between the lower endpoint and upper endpoint of the depth of focus at the focus position of light from the V pattern. In the first time region, the control unit 110 determines the focus position of light from the H pattern as the position of the wafer 60 along the optical axis of the projection optical system 50.

In the second time region, the depth-of-focus region at the focus position of light from the H pattern partially overlaps that at the focus position of light from the V pattern. In the second time region, the control unit 110 determines the position of the wafer 60 along the optical axis of the projection optical system 50 in consideration of the depth of focus at the focus position of light from the H pattern and that at the focus position of light from the V pattern, as described above.

In the second time region, more specifically, first, an endpoint which falls within the depth of focus at the focus position V_C of light from the V pattern, of the lower endpoint H_L and upper endpoint H_U of the depth of focus at the focus position H_C of light from the H pattern, is specified. Next, an endpoint which falls within the depth of focus at the focus position H_C of light from the H pattern, of the lower endpoint V_L and upper endpoint V_U of the depth of focus at the focus position V_C of light from the V pattern, is specified. A position corresponding to the midpoint between the two endpoints specified in this way is determined as the position of the wafer 60 along the optical axis of the projection optical system 50.

In the third time region, the depth-of-focus region at the focus position of light from the H pattern and that at the focus position of light from the V pattern do not overlap each other. In the third time region, the H pattern or the V pattern defocuses, so the control unit 110 interrupts projection of the pattern of the reticle 30 onto the wafer 60 (that is, the job). When the depth-of-focus region at the focus position of light from the H pattern partially overlaps that at the focus position of light from the V pattern, the control unit 110 restarts projection of the pattern of the reticle 30 onto the wafer 60.

In this manner, the focus margin in exposure can be maximized by changing the method of determining the position of the wafer 60 along the optical axis of the projection optical system 50, in accordance with the cumulative time from the start of exposure (job). Note that in this embodiment, the method of determining the position of the wafer 60 along the optical axis of the projection optical system 50 is changed in accordance with the cumulative time from the start of exposure (job). However, the method of determining the position of the wafer 60 along the optical axis of the projection optical system 50 may be changed in accordance with the relationship with which the depth-of-focus region at the focus position of light from the H pattern and that at the focus position of light from the V pattern overlap each other.

For the sake of simplicity, the ratios Hratio and Vratio which respectively multiply the focus position of light from the H pattern and that of light from the V pattern may be determined in advance in consideration of the depths of focus in two regions: the first time region and the second time region. In this case, a position corresponding to H_C×Hratio+V_C×Vratio is determined as the position of the wafer 60 along the optical axis of the projection optical system 50. Note that Hratio+Vratio=100%.

A case in which the change in focus position of light from the H pattern is larger than that of light from the V pattern has been taken as an example in this embodiment. However, even if the change in focus position of light from the V pattern is larger than that of light from the H pattern, the position of the wafer 60 along the optical axis of the projection optical system 50 can similarly be determined in consideration of the depths of focus.

Also, the measurement pattern 80, measurement pattern 90, and detection unit 100 have been taken as an example of an obtaining unit which obtains the focus position of light from the H pattern and that of light from the V pattern in this embodiment. However, the focus position of light from the H pattern and that of light from the V pattern can also be obtained by simulation or based on the past records, in place of actual measurement.

When, for example, simulation takes place, a ray trace is performed from each of the H pattern and the V pattern to the image plane of the projection optical system, based on the line width and pitch of the H pattern, the line width and pitch of the V pattern, the illumination conditions (for example, σ), and information (for example, NA) associated with the projection optical system. This makes it possible to obtain the focus position of light from the H pattern and that of light from the V pattern.

Also, when the focus position of light from the H pattern and that of light from the V pattern are obtained based on the past records, it is necessary to take into consideration the illuminance, the cumulative time from the start of exposure, and the exposure interruption time for the past record values. If the illuminance is higher than the past records, the change in temperature of the projection optical system is relatively large, and the change in focus position, in turn, is relatively large. Therefore, for example, the focus position obtained in the past is changed in proportion to the illuminance. Also, because the temperature of the projection optical system drops upon exposure interruption, the focus position changes. The relationship between the exposure interruption time and the change in focus position can be obtained by obtaining the exposure interruption time and the focus position at the restart of exposure based on the past records.

In this manner, since the exposure apparatus 1 determines the position of the wafer 60 along the optical axis of the projection optical system 50 in consideration of the depths of focus at the focus positions of light from the H pattern and light from the V pattern, it can reduce defocus. Hence, the exposure apparatus 1 can provide high-quality devices (for example, a semiconductor device, an LCD device, an image sensing device (for example, a CCD), and a thin-film magnetic head) with a high throughput and good economic efficiency. These devices are fabricated through a step of exposing a substrate (e.g., a wafer or glass plate) coated with a photoresist (sensitizer) by using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-156185 filed on Jul. 8, 2010, which is hereby incorporated by reference herein in its entirety.

What is claimed is:
1. An exposure apparatus comprising:
a projection optical system configured to project a pattern of a mask onto a substrate;
a stage configured to move the substrate;
an obtaining unit configured to obtain data of a first imaging position at which light from a first pattern having, as a longitudinal direction thereof, a first direction perpendicular to an optical axis of the projection optical system forms an image via the projection optical system, and data of a second imaging position at which light from a second pattern having, as a longitudinal direction thereof, a second direction which is not parallel to the first direction and is perpendicular to the optical axis of the projection optical system forms an image via the projection optical system, when the first pattern and the second pattern are respectively placed on an object plane of the projection optical system; and a control unit configured to control the stage so that the substrate is positioned at a target position of the substrate along the optical axis in projecting the pattern of the mask onto the substrate, wherein letting H_C be the first imaging position, V_C be the second imaging position, Hratio be a ratio determined based on the depth of focus at the first imaging position, an Vratio be a ratio determined based on the depth of focus at the second imaging position, the control unit controls the stage so that the substrate is positioned at the target position of H_C ×Hratio +V_C ×Vratio obtained by multiplying the first imaging position and the second imaging position by the ratio Hratio and the ratio Vratio, where Hratio +Vratio =100%, when a mixed pattern that combines a pattern having the first direction as a longitudinal direction thereof and a pattern having the second direction as a longitudinal direction thereof is determined as the pattern of the mask and projected onto the substrate.

2. The apparatus according to claim 1, wherein the depth of focus is obtained by transferring the first pattern and the second pattern onto the substrate and measuring the transferred first pattern and the transferred second pattern.

3. The apparatus according to claim 1, wherein the obtaining unit obtains a relationship between a line width of the first pattern and the depth of focus at the first imaging position and a relationship between a line width of the second pattern and the depth of focus at the second imaging position.

4. The apparatus according to claim 1, wherein the obtaining unit obtains the depth of focus at the first imaging position based on a line width of the first pattern and obtains the depth of focus at the second imaging position based on a line width of the second pattern.

5. A device fabrication method comprising steps of:
exposing a substrate using an exposure apparatus; and
performing a development process for the substrate exposed, wherein the exposure apparatus includes:
a projection optical system configured to project a pattern of a mask onto the substrate;
a stage configured to move the substrate;
an obtaining unit configured to obtain data of a first imaging position at which light from a first pattern having, as a longitudinal direction thereof, a first direction perpendicular to an optical axis of the projection optical system forms an image via the projection optical system, and data of a second imaging position at which light from a second pattern having, as a longitudinal direction thereof, a second direction which is not parallel to the first direction and is perpendicular to the optical axis of the projection optical system forms an image via the projection optical system, when the first pattern and the second pattern are respectively placed on an object plane of the projection optical system; and
a control unit configured to control the stage so that the substrate is positioned at a target position of the substrate along the optical axis in projecting the pattern of the mask onto the substrate, wherein letting H_C be the first imaging position, V_C be the second imaging position, Hratio be a ratio determined based on the depth of focus at the first imaging position, an Vratio be a ratio determined based on the depth of focus at the second imaging position, the control unit controls the stage so that the substrate is positioned at the target position of H_C ×Hratio +V_C ×Vratio obtained by multiplying the first imaging position and the second imaging position by the ratio Hratio and the ratio Vratio, where Hratio +Vratio =100%, when a mixed pattern that combines a pattern having the first direction as a longitudinal direction thereof and a pattern having the second direction as a longitudinal direction thereof is determined as the pattern of the mask and projected onto the substrate.

* * * * *